United States Patent
Sharma et al.

(10) Patent No.: US 7,267,997 B1
(45) Date of Patent: Sep. 11, 2007

(54) PROCESS FOR FORMING MAGNETIC MEMORY STRUCTURES

(75) Inventors: Manish Sharma, Sunnyvale, CA (US); Lung Tran, Saratoga, CA (US)

(73) Assignee: Samsung Electronics Co., Ltd. (KR)

( * ) Notice: Subject to any disclaimer, the term of this patent is extended or adjusted under 35 U.S.C. 154(b) by 363 days.

(21) Appl. No.: 11/118,828

(22) Filed: Apr. 29, 2005

(51) Int. Cl.
*H01L 21/00* (2006.01)

(52) U.S. Cl. ................................ 438/3; 257/E21.665

(58) Field of Classification Search ............... 438/3; 257/E21.665
See application file for complete search history.

(56) References Cited

U.S. PATENT DOCUMENTS

| | | | |
|---|---|---|---|
| 5,764,445 A * | 6/1998 | Torng et al. ............ 360/327.32 |
| 6,686,210 B1 | 2/2004 | Gilbert et al. |
| 6,801,415 B2 | 10/2004 | Slaughter et al. |
| 2002/0073785 A1* | 6/2002 | Prakash et al. ......... 73/862.041 |
| 2004/0042128 A1 | 3/2004 | Slaughter et al. |
| 2005/0003561 A1 | 1/2005 | Drewes |
| 2005/0014295 A1* | 1/2005 | Sharma .................... 438/3 |
| 2005/0174836 A1* | 8/2005 | Sharma et al. ............ 365/171 |
| 2005/0230771 A1* | 10/2005 | Ha et al. .................. 257/421 |
| 2006/0023371 A1* | 2/2006 | Chau et al. .............. 360/324.1 |
| 2006/0098354 A1* | 5/2006 | Parkin ..................... 360/324.2 |
| 2006/0146601 A1* | 7/2006 | Miltat et al. ............. 365/171 |
| 2006/0176734 A1* | 8/2006 | Braun ...................... 365/171 |

* cited by examiner

*Primary Examiner*—B. William Baumeister
*Assistant Examiner*—Igwe U. Anya
(74) *Attorney, Agent, or Firm*—Myers Bigel Sibley & Sajovec PA

(57) ABSTRACT

An exemplary method for making a memory structure comprises forming a first ferromagnetic layer, forming a spacer layer above the first ferromagnetic layer, forming a second ferromagnetic layer above the spacer layer by applying a first deposition process to form a thin layer of ferromagnetic material substantially covering the spacer layer, the first layer being formed at a first energy level, and applying a second deposition process to form the remainder of the second ferromagnetic layer above the thin layer of ferromagnetic material, the second ferromagnetic layer being formed at a second energy level, higher than the first energy level. This way, the spacer layer is protected by the thin layer during the second energy level deposition.

21 Claims, 4 Drawing Sheets

First Layer Forming at a First Energy Level

Second Layer Forming at a Second Energy Level

PROCESS FOR FORMING MAGNETIC MEMORY STRUCTURES

BACKGROUND

A memory chip generally comprises a plurality of memory cells that are deposited onto a silicon wafer and addressable via an array of column conducting leads (bit lines) and row conducting leads (word lines). Typically, a memory cell is situated at the intersection of a bit line and a word line. The memory cells are controlled by specialized circuits that perform functions such as identifying rows and columns from which data are read or to which data are written. Typically, each memory cell stores data in the form of a "1" or a "0," representing a bit of data.

An array of magnetic memory cells can be referred to as a magnetic random access memory or MRAM. MRAM is generally nonvolatile memory (i.e., a solid state chip that retains data when power is turned off). At least one type of magnetic memory cell includes a data layer and a reference layer, separated from each other by at least one intermediate layer. The data layer may also be referred to as a bit layer, a storage layer, or a sense layer. The reference layer may also be referred to as a pinned layer. In a magnetic memory cell, a bit of data (e.g., a "1" or "0") may be stored by "writing" into the data layer via one or more conducting leads (e.g., a bit line and a word line). The write operation is typically accomplished via a write current that sets the orientation of the magnetic moment in the data layer to a predetermined direction.

Once written, the stored bit of data may be read by providing a read current through one or more conducting leads (e.g., a read line) to the magnetic memory cell. For each memory cell, the orientations of the magnetic moments of the data layer and the reference layer are either parallel (in the same direction) or anti-parallel (in different directions) to each other. The degree of parallelism affects the resistance of the cell, and this resistance can be determined by sensing (e.g., via a sense amplifier) an output current or voltage produced by the memory cell in response to the read current.

More specifically, if the magnetic moments are parallel, the resistance determined based on the output current is of a first relative value (e.g., relatively low). If the magnetic moments are anti-parallel, the resistance determined is of a second relative value (e.g., relatively high). The relative values of the two states (i.e., parallel and anti-parallel) are typically different enough to be sensed distinctly. A "1" or a "0" may be assigned to the respective relative resistance values depending on design specification. The sensed current is inversely proportional to the resistance of the magnetic memory cell. Thus, $I_s=V/R$ (when magnetic moments are parallel) or $I_s=V/(R+\Delta R)$ (when magnetic moments are anti-parallel), where V is the applied voltage, $I_s$ is the sensed current, R is the nominal resistance of the magnetic memory cell, and $\Delta R$ is the change in resistance.

The intermediate layer, which may also be referred to as a spacer layer, may comprise insulating material (e.g., dielectric), non-magnetic conducting material, and/or other known materials, and is usually thick enough to prevent exchange coupling between the data and reference layers. The various conducting leads which are used to address the memory cells (e.g., bit lines, word lines, and read lines), and to provide currents to pass through the data and reference layers to read data from or write data to the memory cells are provided by one or more additional layers, called conducting layer(s).

Throughout this application, various exemplary embodiments will be described in reference to the TMR memory cells as first described above. Those skilled in the art will readily appreciate that the exemplary embodiments may also be implemented with other types of magnetic memory cells (e.g., other types of TMR memory cells, GMR memory cells, AMR memory cells, CMR memory cells, etc.) according to the requirements of a particular implementation.

Magnetic properties of the ferromagnetic layers (e.g., the data layer and the reference layer) in magnetic memory cells are affected by the texture of the layers. Texture generally refers to the degree of uniformity of the crystal orientation in a layer of material. For example, a layer having a good texture generally has a high degree of crystal orientation uniformity. Whether a layer of material has good texture may also be determined based on one or more additional factors such as grain size, number of grain boundaries, smoothness, etc. In general, larger crystal grains are preferred over smaller grains, and a smaller number of grain boundaries is preferred over a larger number. However, when crystal grains are too large, undesirable dome shaped features may appear at the surface of the layer, resulting in unevenness.

Good texture in a layer of ferromagnetic material can be achieved by supplying enough kinetic energy to the atoms during deposition to allow them to bond into larger grains, have fewer grain boundaries, and form a higher uniformity of crystal orientation. For example, high energy may be supplied by heating the layer during (or subsequent to) deposition, applying high energy physical sputtering, and/or other techniques known in the art.

However, forming a ferromagnetic layer on top of a spacer layer (e.g., a data layer in a bottom-pinned or a reference layer in a top-pinned memory cell) using a high energy deposition may cause unacceptable damages to the spacer layer.

Thus, a market exists for a process to form ferromagnetic layers having a substantially uniform crystal orientation while reducing damage to the spacer layer beneath the ferromagnetic layers.

SUMMARY

An exemplary method for making a memory structure comprises forming a data layer, forming a spacer layer above the data layer, forming a reference layer above the spacer layer by applying a first deposition process to form a first layer of ferromagnetic material substantially covering the spacer layer, the first layer forming at a first energy level, and applying a second deposition process to form the remainder of the reference layer above the first layer of ferromagnetic material, the remainder of the reference layer forming at a second energy level, higher than the first energy level, and forming an anti-ferromagnetic layer above the reference layer. The first layer of ferromagnetic material has a higher degree of crystal orientation misalignment than the remainder of the reference layer.

Other embodiments and implementations are also described below.

DETAILED DESCRIPTION

I. Overview

Exemplary improved manufacturing processes for making improved magnetic memory structures are described herein.

Section II describes an exemplary magnetic memory structure.

Section III describes certain characteristics of the exemplary magnetic memory structure.

Section VI describes an exemplary improved process for making the exemplary magnetic memory structure.

II. An Exemplary Memory Structure Configuration

Figure 1:
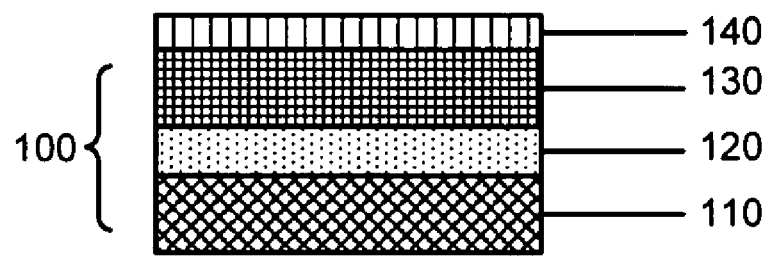
FIG. 1 illustrates an exemplary magnetic memory structure.

Generally, a memory structure may be made as top-pinned (where the reference layer is on top of the data layer) or bottom-pinned (where the reference layer is below the data layer). For ease of explanation, only the top-pinned configuration is shown in FIG. 1 and referenced in the description of various exemplary embodiments herein. However, this configuration is merely illustrative. Thus, one skilled in the art will readily appreciate that other configurations (e.g., bottom-pinned, etc.) may also be implemented using the exemplary processes disclosed herein in accordance with any particular design requirement.

The top-pinned memory structure 100 includes a data layer 110, a spacer layer 120, a reference layer 130, and an anti-ferromagnetic layer 140. For ease of explanation, the combination of the data layer 110, the spacer layer 120, and the reference layer 130 may also be referred to as a memory cell 100. Of course, the memory cell 100 may also be bottom-pinned (not shown), in which case the reference layer 130 and the antiferromagnetic layer 140 are below the data layer 110. For clarity of illustration, additional structures and/or layers known in the art are not illustrated in FIG. 1. For example, a first conductor (not shown) and a second conductor (not shown) may be placed orthogonally, where one is above and the other is below the memory cell 100, and be used collectively for both write and read operations.

Another magnetic memory structure configuration may also include a seed layer, a protective cap layer, and/or other layers. The seed layer generally enhances crystalline alignment. Exemplary materials for a seed layer include Ta, Ru, NiFe, Cu, or combinations of these materials. The protective cap layer protects the data layer 130 from the environment (e.g., by reducing oxidation of the data layer 130) and may be formed using any suitable material known in the art, for example, Ta, TaN, Cr, Al or Ti. For ease of explanation, these additional layers are not shown in the Figures; however, magnetic memory structures having one or more of these additional layers may be implemented with various embodiments to be described herein in accordance with a particular design choice.

The data layer 110 may comprise one or more ferromagnetic materials. In an exemplary embodiment, ferromagnetic materials suitable for the data layer 110 include, without limitation, NiFe, NiFeCo, CoFe, other magnetic alloys of NiFe and Co, amorphous ferromagnetic alloys, and other materials.

In an exemplary embodiment, the spacer layer 120 is a tunnel barrier layer (e.g., if the memory cell 100 is a TMR memory cell). In this embodiment, the spacer layer 120 may be made of $SiO_2$, $SiN_x$, MgO, $Al_2O_3$, $AlN_x$, $TaO_x$, and/or other insulating materials. The thickness of tunnel barrier layer may range from approximately 0.5 nanometers to 3 nanometers.

In another exemplary embodiment, the spacer layer 120 is a non-magnetic conducting layer (e.g., if the memory cell 100 is a GMR memory cell). In this embodiment, the spacer layer 120 may be made of Cu, Au, Ag, and/or other non-magnetic conducting materials.

The reference layer 130 may comprise one or more ferromagnetic materials. In an exemplary embodiment, ferromagnetic materials suitable for the reference layer 130 include NiFe, NiFeCo, CoFe, other magnetic alloys of NiFe and Co, amorphous ferromagnetic alloys, and other materials. The data layer 110 and the reference layer 130 may be made of the same or different materials.

The anti-ferromagnetic layer 140 enhances magnetic stability in the reference layer 130. Exemplary materials for an AFM layer include IrMn, FeMn, NiMn, PtMn, and/or other well known materials.

III. Certain Characteristics of Magnetic Memory Structures

Typically, a ferromagnetic layer (e.g., the data layer, the reference layer, etc.) has an inherent resistance (i.e., based on the layer's material and thickness) that has to be overcome in order to change the magnetic orientation of the layer (e.g., changing the magnetic orientation of the data layer during a write operation). For example, the inherent resistance of a material can be overcome by the vector sum of magnetic fields emanating from two orthogonal current carrying conducting leads (i.e., a bit line and a word line). The amount of magnetic energy needed to overcome the inherent resistance of a material is dependent on the material's coercivity in units of Oersteds (Oe).

When the data layer and the reference layer are made of the same ferromagnetic material, their coercivity is the same. However, in order for a magnetic memory cell to function properly, the magnetic orientation of the reference layer has to remain unchanged (e.g., pinned) when a sufficient amount of magnetic field is applied near the data layer to switch its magnetic orientation. One technique to pin the magnetic orientation of the reference layer is to form and bond an antiferromagnetic layer to the reference layer. The antiferromagnetic layer can effectively shift the coercivity of the reference layer. As a result, the magnetic orientation of the reference layer can only be switched when a substantially higher magnetic energy is applied compared to the magnetic energy needed for switching the magnetic orientation of the data layer.

Figure 2:
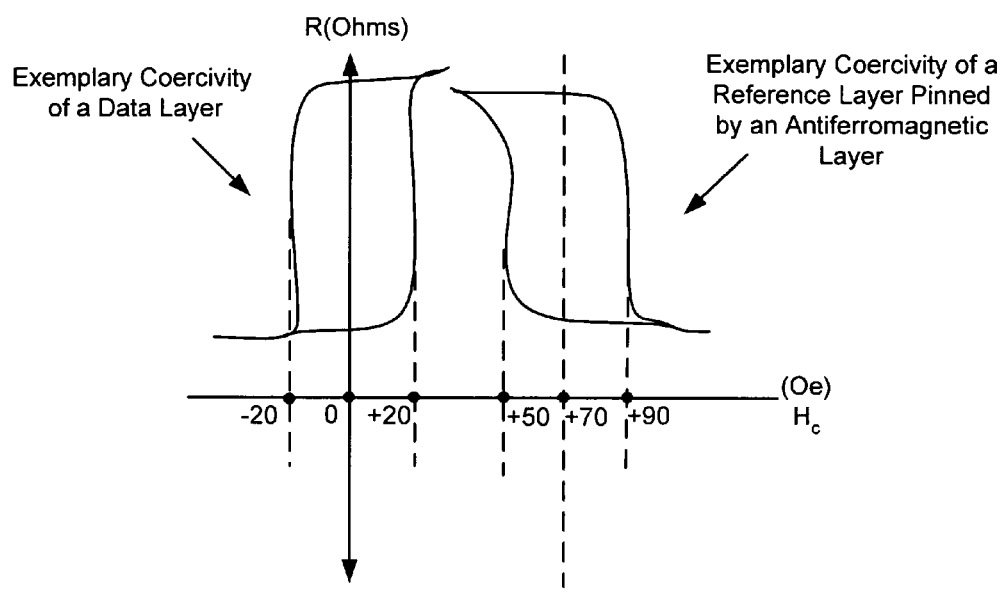
FIG. 2 illustrates exemplary coercivity graphs of a data layer and a reference layer of the magnetic memory structure of FIG. 1.

FIG. 2 illustrates exemplary graphical representations of the coercivity of a data layer and the coercivity of a reference layer pinned by an antiferromagnetic layer, respectively. In this example, the magnetic orientation of the data layer can be switched from one direction to the opposite direction by application of −20 to 20 Oe of magnetic switching field. On the other hand, the magnetic orientation of the reference layer can be switched by application of 50 to 90 Oe of magnetic switching field. Thus, data can be stored in the data layer (by switching its magnetic orientation from one direction to an opposite direction) without affecting the magnetic orientation of the reference layer.

In order for the magnetic orientation of a reference layer to be properly pinned by an antiferromagnetic layer, the reference layer and the antiferromagnetic layer have to establish good exchange coupling. Good exchange coupling can be established if the layers both have good texture, e.g., both have the same substantially uniform crystal orientation. Depending on the material(s) used, the desired crystal orientation for these layers may be different. For example, when using one or more of the materials described in the previous section, crystal grains of the reference layer and the antiferromagnetic layers should have the crystal orientation of <111>.

In a top-pinned configuration where the reference layer 130 and antiferromagnetic layer 140 are above the spacer layer 120 and the data layer 110, the data layer 110 can be formed on top of a seed layer (not shown). The seed layer will effectively guide the crystal growth of subsequent crystalline material in a predetermined desired crystal orientation. However, the spacer layer 120, which is typically made of amorphous oxide, will break the crystalline pattern. Thus, the reference layer 130 growing on top of the spacer layer 120 generally has to be deposited at high energy to re-establish good texture (e.g., a substantially uniform crystal orientation).

Similarly, in a bottom-pinned configuration, the antiferromagnetic layer 140 and reference layer 130 can be formed on top of a seed layer so they can be formed with good texture. However, above the spacer layer 120, crystalline texture has to be re-established when forming the data layer 110.

In either top-pinned or bottom-pinned configurations, the spacer layer 120 can be damaged if the ferromagnetic layer being deposited above it is being formed using high energy deposition techniques (e.g., high energy physical sputtering). Thus, in the exemplary embodiments described herein, a modified process is described where the spacer layer 120 is protected by a first layer of ferromagnetic material formed using a first deposition process which causes the first layer to be forming at a first energy level (e.g., a low energy level that does not cause unacceptable damage to the spacer layer 120). Subsequently, the rest of the ferromagnetic material is formed by a second deposition process which causes the rest of the ferromagnetic material to be forming at a second energy level, higher than the first energy level to establish good texture. For example, the first deposition process may be a low energy physical sputtering process and the second deposition process may be a high energy physical sputtering process which can be achieved by increasing the energy level of the low energy sputtering process after the first layer has been formed. This way, the spacer layer 120 is substantially protected by the first layer of ferromagnetic material during a subsequent higher energy deposition and damage to the spacer layer can be reduced or minimized. Further, the second deposition process which causes the rest of the ferromagnetic material to be forming at a higher energy level enables the majority of the ferromagnetic layer being formed to have good texture (e.g., a substantially uniform crystal orientation).

IV. An Exemplary Process for Forming the Exemplary Magnetic Memory Structure

Figure 3:
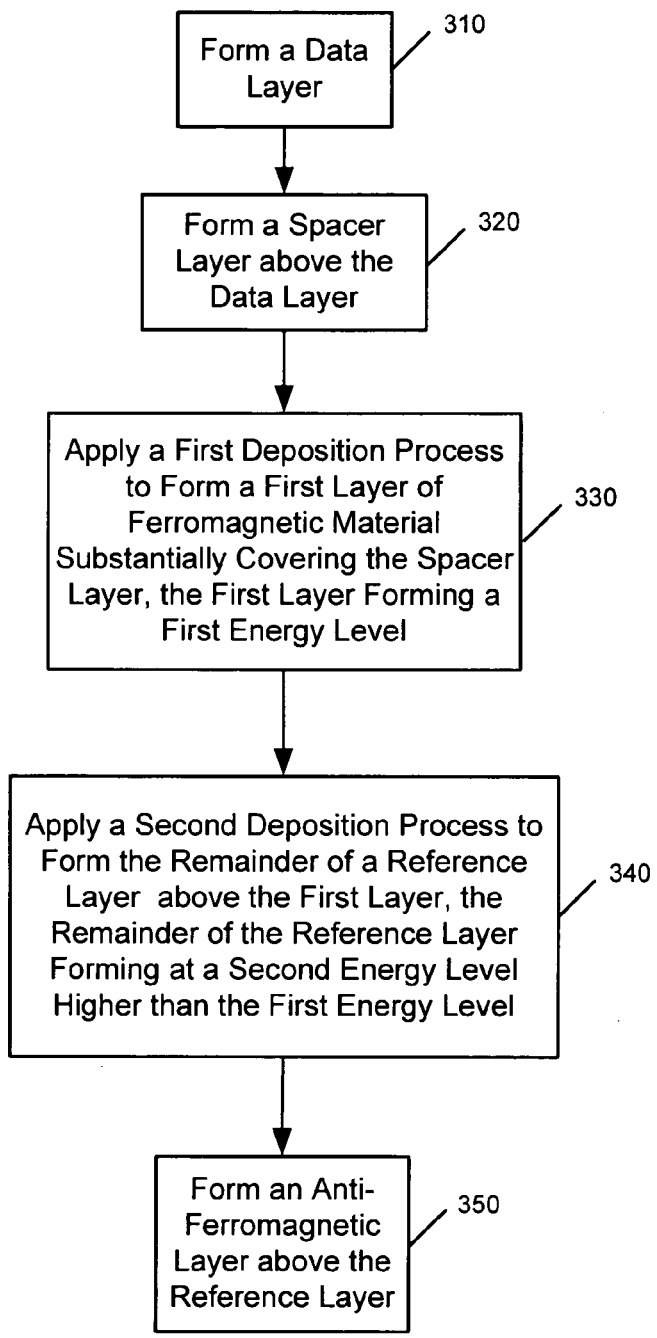
FIG. 3 illustrates a flow chart of an exemplary process for making the magnetic memory structure of FIG. 1.

FIG. 3 illustrates an exemplary process for making the exemplary magnetic memory structure of FIG. 1. FIGS. 4A-4E illustrate exemplary magnetic memory structure layers being made in accordance with the process steps of FIG. 3. In FIGS. 3 and 4A-4E, the layers formed one above the other are, in due course, patterned and etched into multiple patterned layers for forming multiple memory cells. These patterning and etching steps are well known in the art and need not be described herein.

Figure 4A:
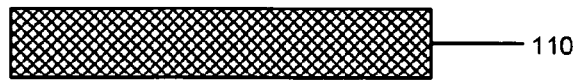
FIGS. 4A-4E illustrate exemplary memory structure layers during execution of the exemplary process of FIG. 3.

At step 310, a data layer is formed by deposition or other techniques known in the art (e.g., via sputtering, evaporation, chemical vapor deposition, atomic layer deposition (ALD), and/or other known techniques). An exemplary data layer 110 is illustrated in FIG. 4A. In an exemplary implementation, the data layer 110 can be formed above a seed layer (not shown) to enhance crystalline alignment using techniques known in the art.

Figure 4B:
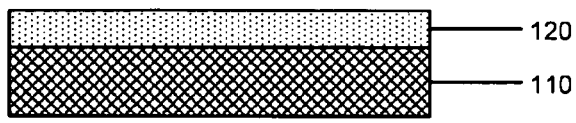

At step 320, a spacer layer is formed by deposition or other techniques known in the art. An exemplary spacer layer 120 is illustrated in FIG. 4B.

Next, a reference layer 130 is formed by the process described in steps 330 and 340.

Figure 4C:
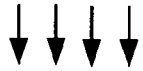
Figure 4C:
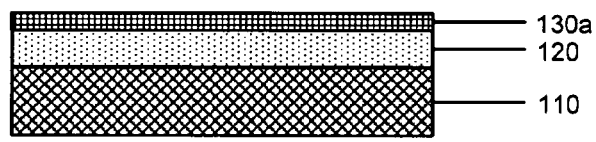

At step 330, a first layer comprising ferromagnetic material is formed by applying a first deposition process which causes the first layer to be formed at a first energy level (e.g., a low energy level). In an exemplary implementation, the first layer of ferromagnetic material is formed by depositing the layer using low energy physical sputtering until the layer substantially covers the spacer layer 120. The energy applied should be low enough to reduce damage caused by atomic bombardment of the spacer layer 120. For example, a typical range of low energy may be between 20-200 W of DC power applied to a magnetron sputter gun with a 3-inch target area. An exemplary first layer 130a (of the reference layer 130) is illustrated in FIG. 4C.

Figure 4D:
Figure 4D:
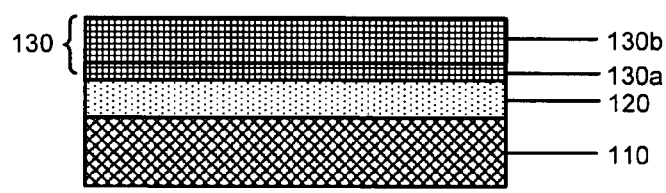

At step 340, the remainder of the reference layer (comprising ferromagnetic material) is formed above the first layer of ferromagnetic material by applying a second deposition process which causes the remainder of the reference layer to be formed at a second energy level (e.g., a high energy level), higher than the first energy level. In an exemplary implementation, the remainder of the reference layer is formed by increasing the energy level of the physical sputtering deposition to a sufficiently high energy such that crystals formed in the layer have substantially the same desired orientation (e.g., <111> orientation). For example, a typical range of high energy may be between 100-500 W of DC power applied to a magnetron sputter gun with a 3-inch target area. The exemplary ranges of low and high energies provided herein are merely illustrative. The DC powers to be applied depend on many factors, such as the design of the deposition system. In an exemplary implementation, the deposition powers can be determined by first depositing multiple films at various power levels then determining the most suitable power levels by examining the deposited films. For example, the texture of the films can be studied by using characterization techniques such as X-ray diffraction and magnetic measurements. The spacer layer 120 is substantially covered by the first layer 130a (of the reference layer 130) so that any damage during the high energy deposition of the remainder of the reference layer 130 is substantially reduced. The first layer and the remainder layer of ferromagnetic material combine to form the reference layer 130. An exemplary remainder layer 130b (of the reference layer 130) is illustrated in FIG. 4D.

The exemplary deposition processes described above are merely illustrative. Other deposition techniques and/or changes in deposition parameters can be implemented to change the energy levels of the layers being deposited. For example, in magnetron sputtering (either RF or DC), a plasma is generated in a gas ambient close to a magnetron power source. When the plasma bombards the target (which is usually the cathode of the magnetron), material gets ejected from the target and deposited on a nearby substrate. The energy level at which the ejected material hits the substrate can be varied by changing one or more parameters which may include, without limitation, the deposition power, the type of gas mixture used (e.g., Ar, O2, Xe, N2, etc.), the gas pressure, the gas flow rate, the target-to-substrate distance, the target-to-substrate angle, and/or other parameters.

Layers may also be deposited using an ion beam deposition. During ion beam deposition, the target (of desired material) is bombarded with an ion beam. The material ejected from the target is deposited on a nearby substrate. Energy level of the material being deposited on the substrate can be varied by changing one or more parameters which may include, without limitation, the energy of the incident ion beam, the species of the gas in the chamber, the gas pressure, the target-to-substrate distance, the target-to-substrate angel, and/or other parameters.

Alternatively or in combination, energy levels of a deposited layer may be increased subsequent to or during a deposition process. For example, a glow discharge or an ion beam etching technique can be applied to a deposited or depositing layer. In a glow discharge technique, a high DC voltage is applied between two electrodes to create a plasma discharge in the gas between the two electrodes. The plasma causes any material (e.g., a layer deposited on a substrate) near it to experience collisions with the various species in the gas, thereby transferring energy to the material. In an exemplary implementation, energy may be increased in the remainder of the reference layer by applying a glow discharge technique. In an ion beam etching technique, an ion beam is directed to the surface of a substrate (which may have layers of material deposited on it) to bombard the substrate with a low-energy ion beam (e.g., 100-400V). The bombardment can cause some rearrangement of the surface morphology or some etching of the surface. In an exemplary implementation, crystal orientations in the remainder of the reference layer may be rearranged subsequent or during the deposition process of the layer by applying an ion-beam etching technique.

Figure 4E:
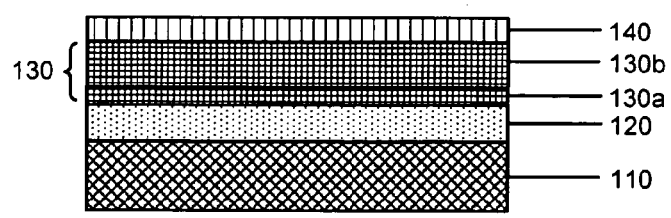

At step 350, an anti-ferromagnetic layer is formed by deposition or other techniques known in the art. In an exemplary implementation, crystals in the anti-ferromagnetic layer have substantially the same orientation as the remainder layer formed in step 340. This way, exchange coupling can be established between the reference layer 130 and the anti-ferromagnetic layer 140 so the memory cell 100 can properly function. An exemplary anti-ferromagnetic layer 140 is illustrated in FIG. 4E.

The manufacturing steps illustrated above are merely exemplary. Those skilled in the art will appreciate that other manufacturing steps may be used in accordance with the requirements of a particular implementation. For example, the various layers as illustrated in FIGS. 4A-4E may be formed in accordance with other manufacturing sequences (e.g., the antiferromagnetic layer 140 and the reference layer 130 may be formed first in a bottom-pinned memory structure), one or more layers may be formed at the same time, one or more layers of different materials may be combined to form a single layer (e.g., a data layer), etc. Further, one skilled in the art will recognize that the two-step process for forming the reference layer 130 can also be applied to form other layers (e.g., a data layer) to protect another layer directly underneath them.

Further, the TMR memory cell illustrated above is merely exemplary. Those skilled in the art will appreciate that other types of memory cells (e.g., GMR memory cells, etc.) may be constructed according to the requirements of a particular implementation. For example, the spacer layer 120 may be a non-magnetic conducting layer for constructing a GMR memory cell.

V. Conclusion

The foregoing examples illustrate certain exemplary embodiments from which other embodiments, variations, and modifications will be apparent to those skilled in the art. The inventions should therefore not be limited to the particular embodiments discussed above, but rather are defined by the claims. Furthermore, some of the claims may include alphanumeric identifiers to distinguish the elements and/or recite elements in a particular sequence. Such identifiers or sequence are merely provided for convenience in reading, and should not necessarily be construed as requiring or implying a particular order of steps, or a particular sequential relationship among the claim elements.

What is claimed is:

1. A method for making a memory structure, comprising:
    forming a data layer;
    forming a spacer layer above said data layer;
    forming a reference layer above said spacer layer by:
        applying a first deposition process to form a first layer of ferromagnetic material substantially covering said spacer layer, said first layer forming at a first energy level; and
        applying a second deposition process to form the remainder of said reference layer above said first layer of ferromagnetic material, said remainder of said reference layer forming at a second energy level, higher than said first energy level; and
    forming an anti-ferromagnetic layer above said reference layer;
    wherein said first layer of ferromagnetic material has a higher degree of crystal orientation misalignment than said remainder of said reference layer.

2. The method of claim 1, wherein said first and second deposition processes include a physical sputtering deposition.

3. The method of claim 1, wherein said first and second deposition processes include an ion beam deposition.

4. The method of claim 1, wherein said first energy level is energy low enough to minimize damage to said spacer layer during deposition.

5. The method of claim 1 wherein said second energy level is energy high enough to form substantially uniform crystal orientation in said remainder of said reference layer.

6. The method of claim 1, wherein said spacer layer is a tunnel barrier layer.

7. The method of claim 1, wherein said antiferromagnetic layer is formed using a high energy deposition.

8. The method of claim 1, wherein said first layer provides protection to said spacer layer during said high energy deposition.

9. The method of claim 1, wherein said crystal orientation is a <111> orientation.

10. The method of claim 1, wherein an exchange coupling is established between said remainder of said reference layer and said anti-ferromagnetic layer to enable said reference layer to remain pinned during a write operation to switch a magnetic orientation of said data layer.

11. A nonvolatile memory array comprising a plurality of magnetic memory structures, said array being made by a process comprising:

forming a data layer;

forming a spacer layer above said data layer;

forming a reference layer above said spacer layer by:
- setting a first energy level for a deposition process to form a first layer of ferromagnetic material substantially covering said spacer layer; and
- setting a second energy level, higher than said first energy level, for said deposition process to form the remainder of said reference layer above said first layer of ferromagnetic material; and forming an anti-ferromagnetic layer above said reference layer;

wherein said first layer of ferromagnetic material has a higher degree of crystal orientation misalignment than said remainder of said reference layer.

12. A method for making a memory structure, comprising:

forming a first ferromagnetic layer;

forming a spacer layer above said first ferromagnetic layer;

forming a second ferromagnetic layer above said spacer layer by:
- applying a first deposition process to form a thin layer of ferromagnetic material substantially covering said spacer layer, said thin layer of ferromagnetic material forming at a first energy level; and
- applying a second deposition process to form the remainder of said second ferromagnetic layer above said thin layer of ferromagnetic material, said remainder of said second ferromagnetic layer forming at a second energy level, higher than said first energy level;

wherein said spacer layer is protected by said thin layer during said second energy level deposition.

13. The method of claim 12, wherein said first ferromagnetic layer is a reference layer and said second ferromagnetic layer is a data layer.

14. The method of claim 12, wherein said first ferromagnetic layer is a data layer and said second ferromagnetic layer is a reference layer.

15. The method of claim 14, further comprising:
forming an antiferromagnetic layer above said reference layer, wherein said antiferromagentic layer and said reference layer establish an exchange coupling between them.

16. The method of claim 12, wherein said first energy level is energy low enough to minimize damage to said spacer layer during deposition.

17. The method of claim 12 wherein said second energy level is energy high enough to form a substantially uniform crystal orientation in said remainder of said second ferromagnetic layer.

18. The method of claim 12, wherein said spacer layer is a tunnel barrier layer.

19. The method of claim 12, wherein said crystal orientation is a <111> orientation.

20. A magnetic memory structure, being made by a process comprising:

forming a first ferromagnetic layer;

forming a spacer layer above said first ferromagnetic layer;

forming a second ferromagnetic layer above said spacer layer by:
- applying a first deposition process to form a thin layer of ferromagnetic material substantially covering said spacer layer, said thin layer forming at a first energy level; and
- applying a second deposition process to form the remainder of said second ferromagnetic layer above said thin layer of ferromagnetic material, said remainder of said second ferromagnetic layer forming at a second energy level, higher than said first energy level;

wherein said spacer layer is protected by said thin layer during said second energy level deposition.

21. A nonvolatile memory array comprising a plurality of magnetic memory structures, said array being made by a process comprising:

forming a data layer;

forming a spacer layer above said data layer;

forming a reference layer above said spacer layer by:
- applying a first deposition process to form a first layer of ferromagnetic material substantially covering said spacer layer, said first layer forming at a first energy level; and
- applying a second deposition process to form the remainder of said reference layer above said first layer of ferromagnetic material, said remainder of said reference layer forming at a second energy level, higher than said first energy level; and forming an anti-ferromagnetic layer above said reference layer;

wherein said first layer of ferromagnetic material has a higher degree of crystal orientation misalignment than said remainder of said reference layer.

* * * * *